United States Patent
Xue et al.

(10) Patent No.: US 8,564,110 B2
(45) Date of Patent: Oct. 22, 2013

(54) POWER DEVICE WITH BOTTOM SOURCE ELECTRODE

(75) Inventors: Yan Xun Xue, Los Gatos, CA (US); Yueh-Se Ho, Sunnyvale, CA (US); Hamza Yilmaz, Saratoga, CA (US); Jun Lu, San Jose, CA (US); Lei Shi, Songjiang (CN); Liang Zhao, Songjiang (CN); Ping Huang, Songjiang (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/480,391

(22) Filed: May 24, 2012

(65) Prior Publication Data

US 2012/0235289 A1    Sep. 20, 2012

Related U.S. Application Data

(60) Continuation-in-part of application No. 13/289,918, filed on Nov. 4, 2011, which is a division of application No. 12/606,290, filed on Oct. 27, 2009, now Pat. No. 8,076,183, application No. 13/480,391, which is a continuation-in-part of application No. 12/968,159, filed on Dec. 14, 2010.

(51) Int. Cl.
*H01L 23/495* (2006.01)

(52) U.S. Cl.
USPC ........... 257/676; 257/666; 257/734; 257/735; 257/E21.51; 257/E23.037; 438/123; 438/124

(58) Field of Classification Search
None
See application file for complete search history.

(56) References Cited

U.S. PATENT DOCUMENTS

| | | | |
|---|---|---|---|
| 7,466,012 B2 * | 12/2008 | Standing et al. | 257/666 |
| 7,790,500 B2 * | 9/2010 | Ramos et al. | 438/106 |
| 2011/0227205 A1 * | 9/2011 | Lu et al. | 257/670 |
| 2012/0025360 A1 * | 2/2012 | Xue et al. | 257/676 |
| 2012/0228696 A1 * | 9/2012 | Carpenter et al. | 257/329 |
| 2013/0130443 A1 * | 5/2013 | Lu et al. | 438/113 |

* cited by examiner

*Primary Examiner* — Zandra Smith
*Assistant Examiner* — Khanh Duong
(74) *Attorney, Agent, or Firm* — Chein-Hwa Tsao; CH Emily LLC

(57) ABSTRACT

A power semiconductor package has an ultra thin chip with front side molding to reduce substrate resistance; a lead frame unit with grooves located on both side leads provides precise positioning for connecting numerous bridge-shaped metal clips to the front side of the side leads. The bridge-shaped metal clips are provided with bridge structure and half or fully etched through holes for relieving superfluous solder during manufacturing process.

16 Claims, 8 Drawing Sheets

PRESENT INVENTION

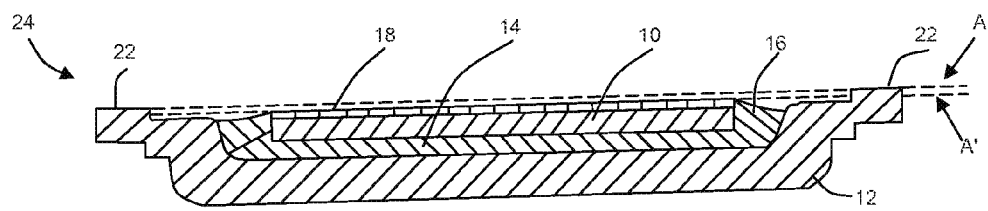
FIG. 1 - PRIOR ART
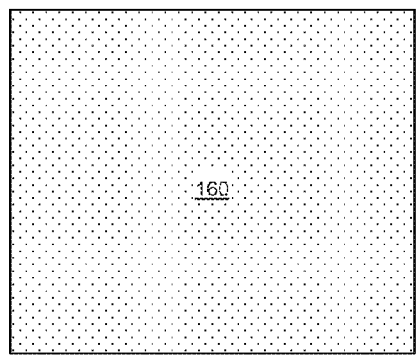
FIG. 2A - PRESENT INVENTION
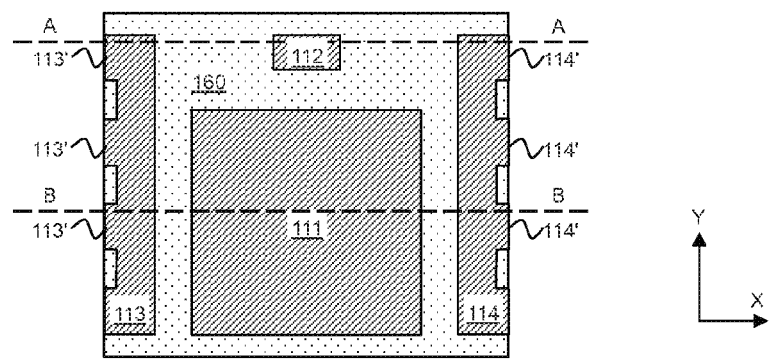
FIG. 2B - PRESENT INVENTION
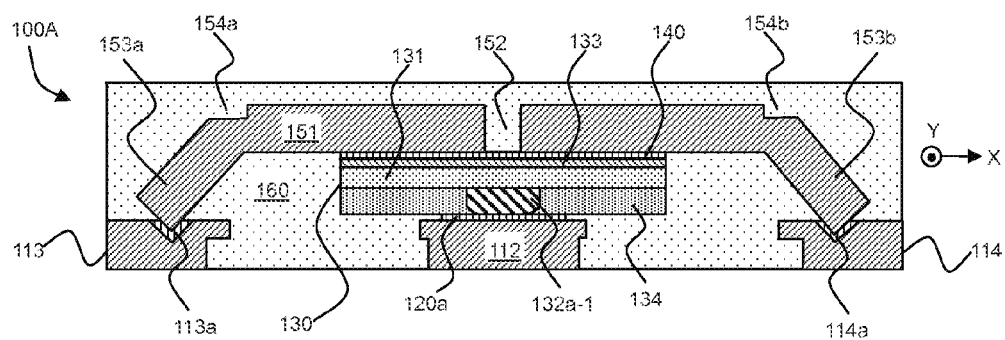
FIG. 2C - PRESENT INVENTION

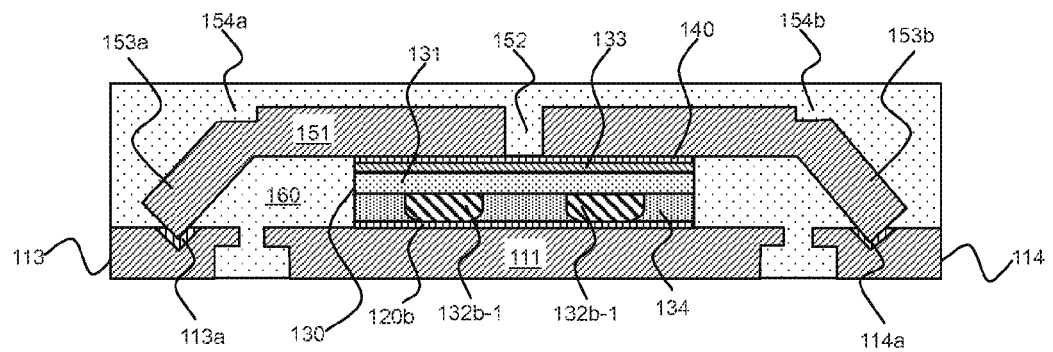
FIG. 2D-1 - PRESENT INVENTION
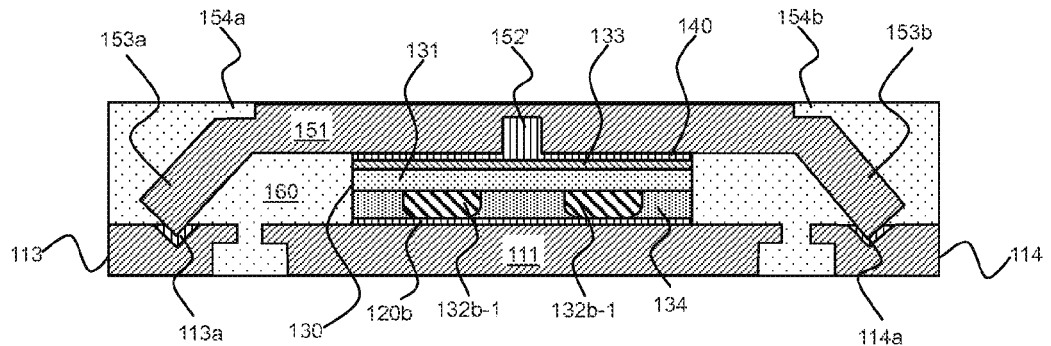
FIG. 2D-2 - PRESENT INVENTION
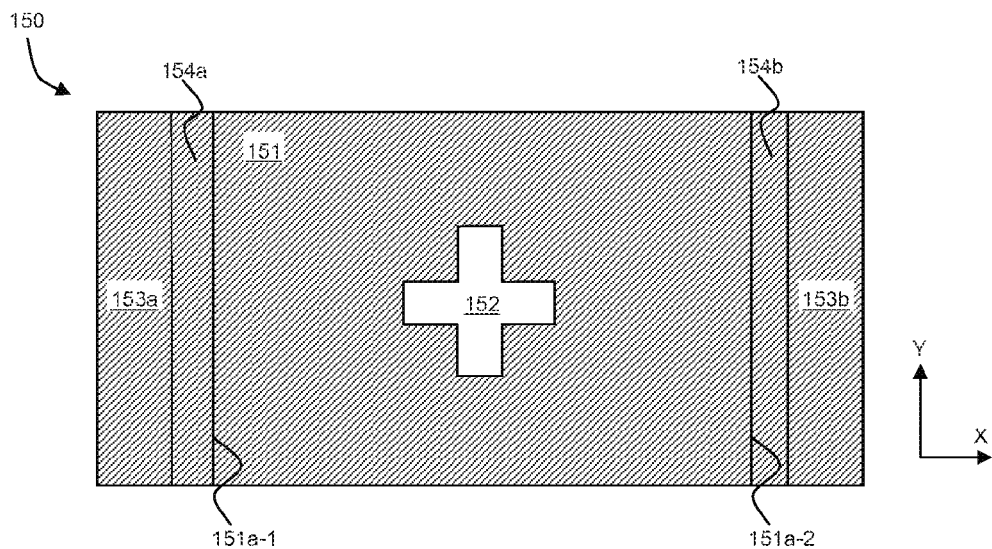
FIG. 2E - PRESENT INVENTION

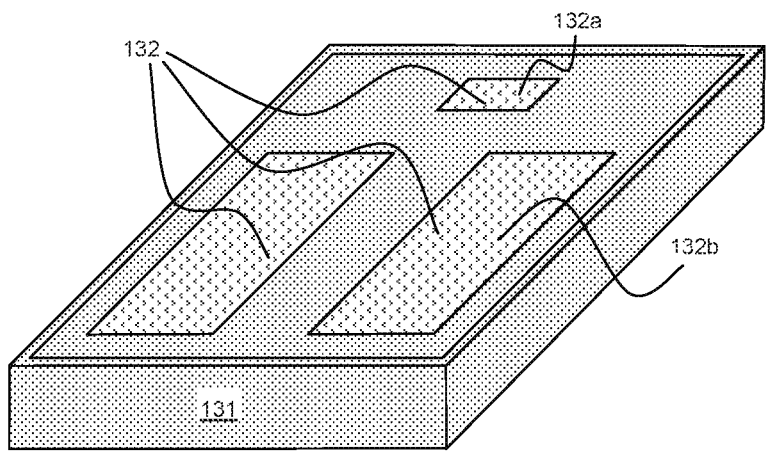
FIG. 3A - PRESENT INVENTION
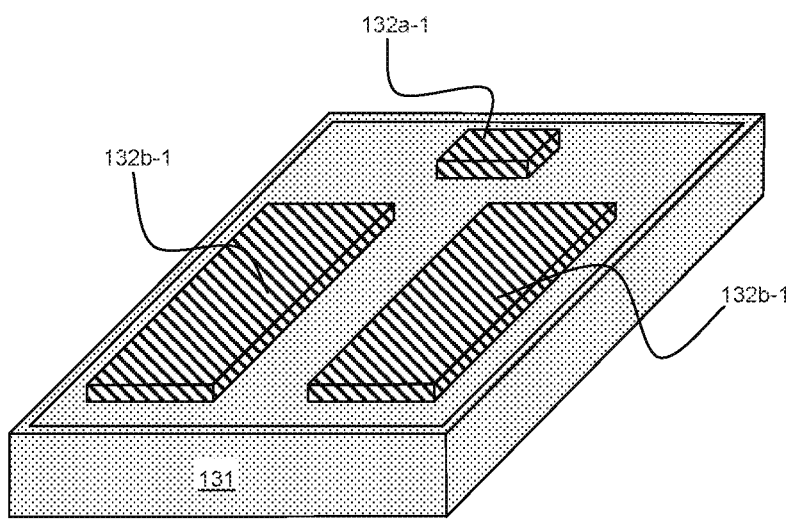
FIG. 3B - PRESENT INVENTION
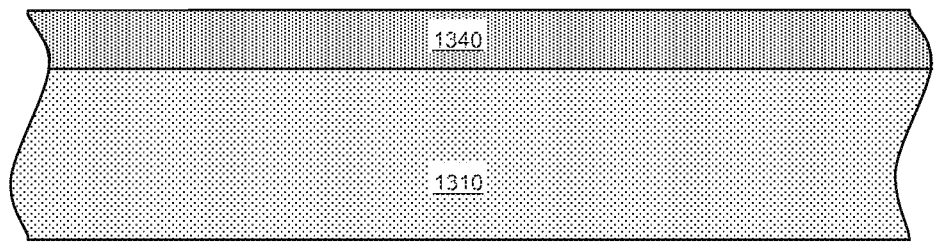
FIG. 3C - PRESENT INVENTION

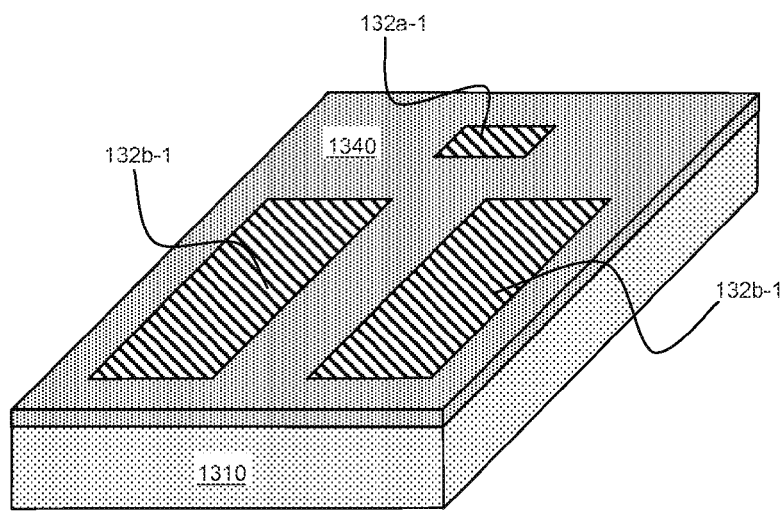
FIG. 3D - PRESENT INVENTION
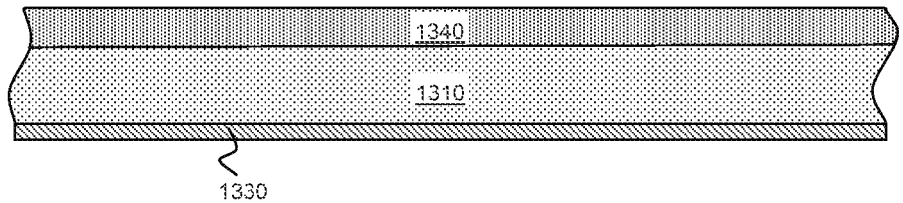
FIG. 3E - PRESENT INVENTION
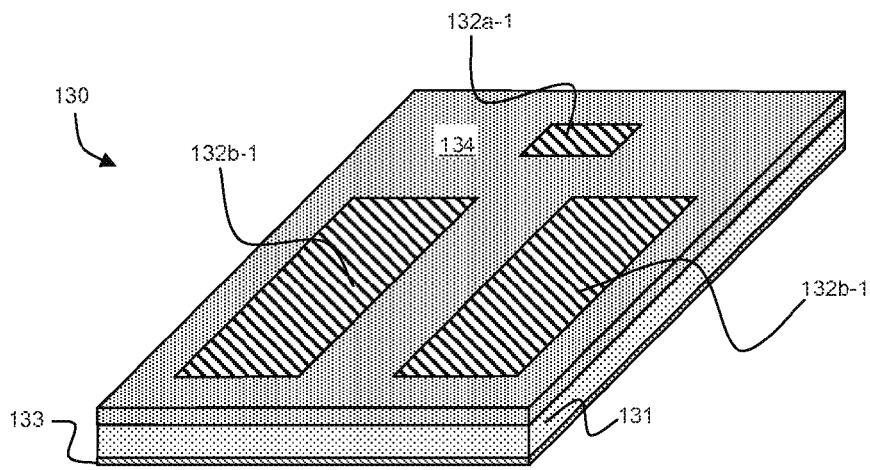
FIG. 3F - PRESENT INVENTION

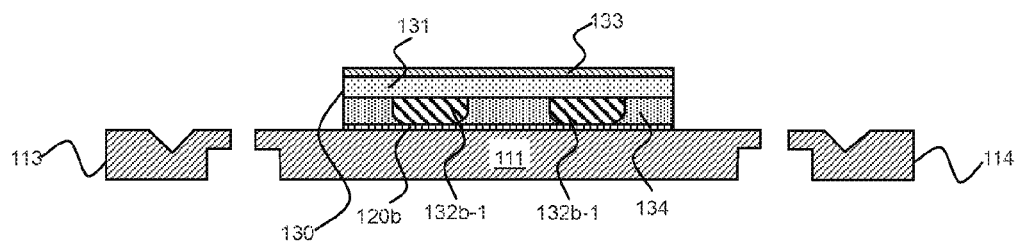
FIG. 4A - PRESENT INVENTION
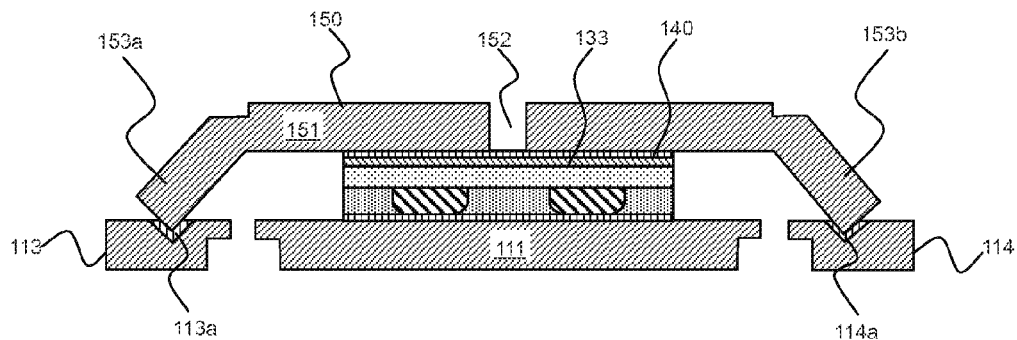
FIG. 4B - PRESENT INVENTION
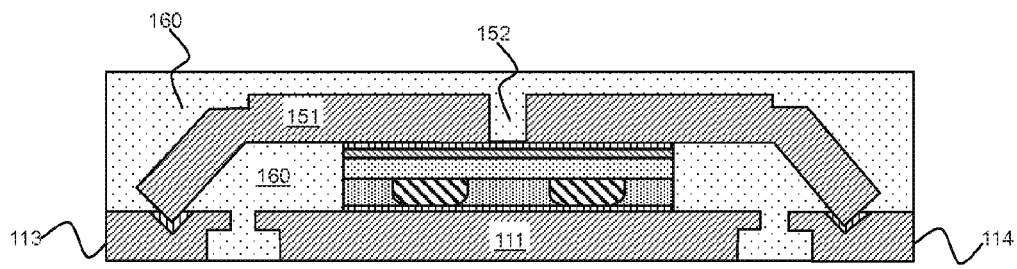
FIG. 4C - PRESENT INVENTION

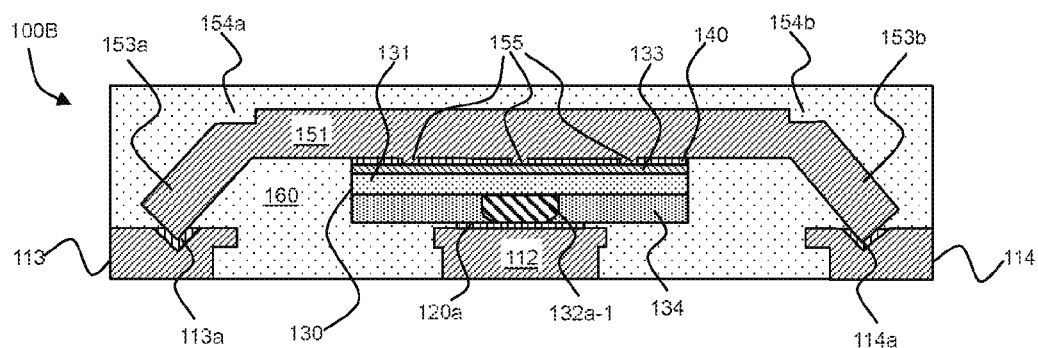
FIG. 5A - PRESENT INVENTION
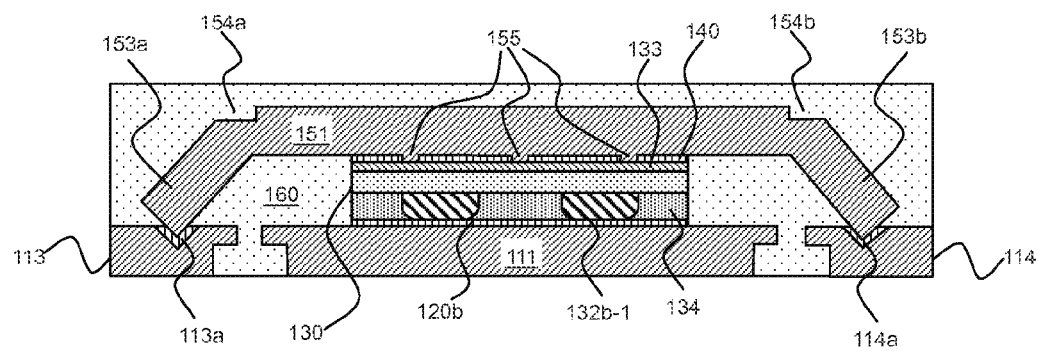
FIG. 5B - PRESENT INVENTION
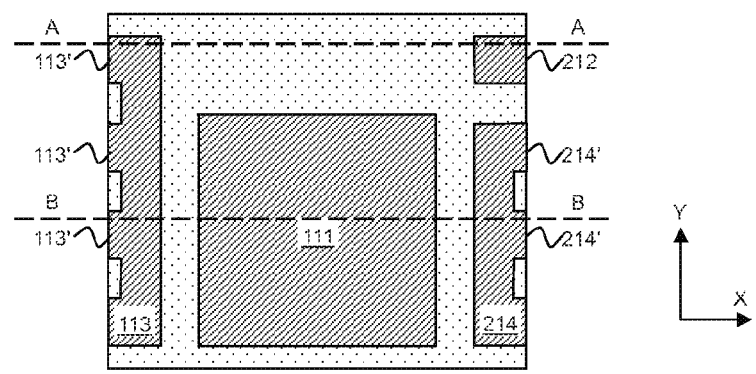
FIG. 6A - PRESENT INVENTION

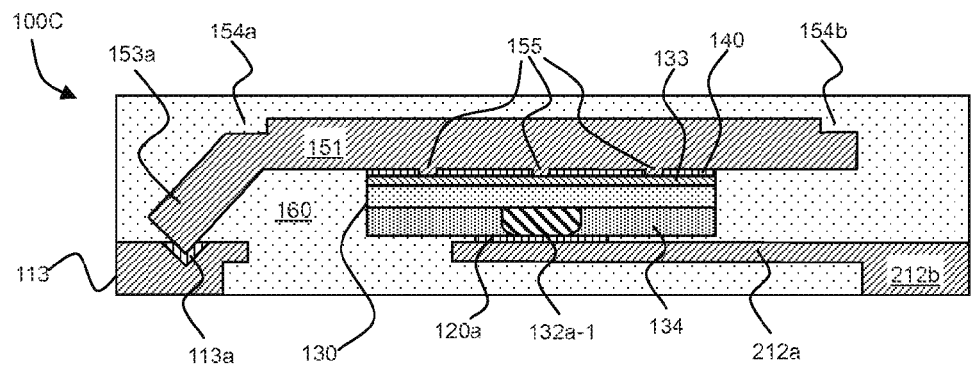
FIG. 6B - PRESENT INVENTION
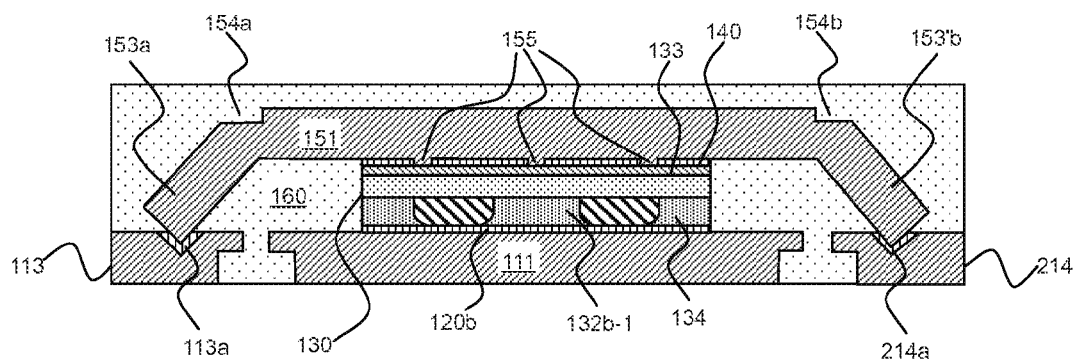
FIG. 6C - PRESENT INVENTION
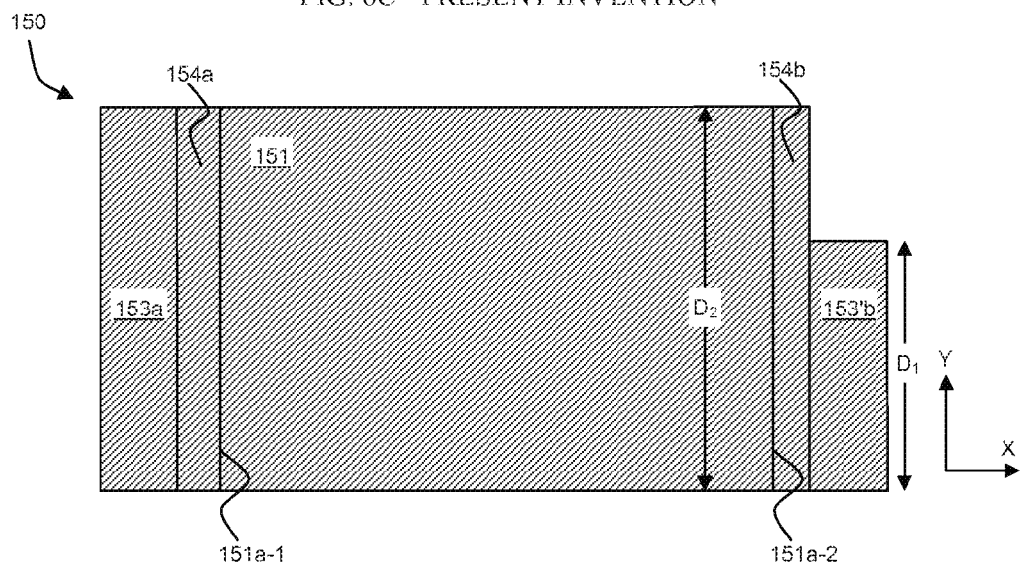
FIG. 6D - PRESENT INVENTION

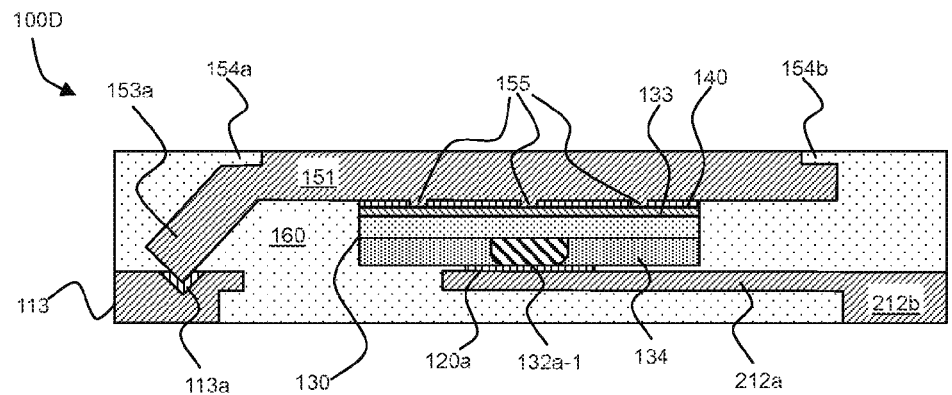
FIG. 7A - PRESENT INVENTION
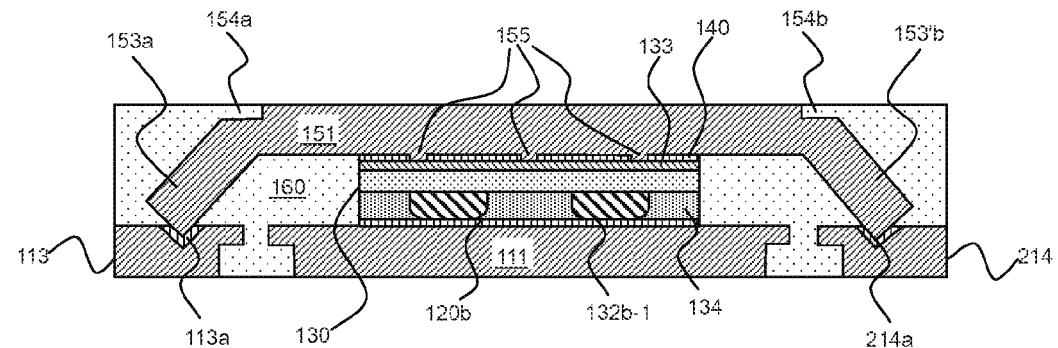
FIG. 7B - PRESENT INVENTION
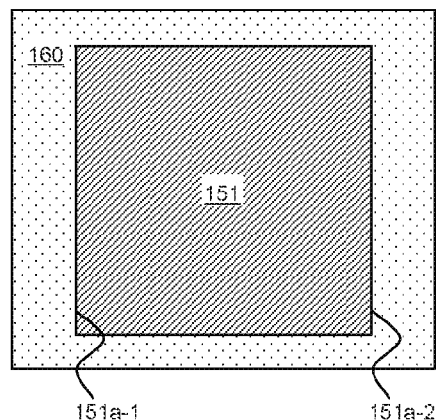
FIG. 7C - PRESENT INVENTION

POWER DEVICE WITH BOTTOM SOURCE ELECTRODE

CROSS-REFERENCE TO RELATED APPLICATIONS

This Patent Application is a Continuation in Part (CIP) Application of a co-pending application Ser. No. 13/289,918 filed on Nov. 4, 2011 by a common inventor of this Application. Application Ser. No. 13/289,918 is a Divisional Application and claims the Priority Date of another application Ser. No. 12/606,290 filed on Oct. 27, 2009 now issued into U.S. Pat. No. 8,076,183. This Patent Application is also a Continuation in Part (CIP) Application of a co-pending application Ser. No 12/968,159 filed on Dec. 14, 2010 by a common inventor of this Application. The Disclosures made in the patent applications Ser. Nos. 13/289,918, 12/606,290, and 12/968,159 are hereby incorporated by reference.

FIELD OF THE INVENTION

This invention relates to a semiconductor power device and preparation method thereof. Particularly, this invention aims at providing a power device with a bottom source electrode and preparation method thereof.

DESCRIPTION OF THE RELATED ART

Power consumption of power devices is commonly very high. In the application of DC-DC power converter devices, some metal electrodes of the devices are usually exposed from plastic packaging material coating a semiconductor chip for improving the electrical connection and heat dissipation performance of the devices. For example, as shown in FIG. 1, US patent application publication US2003/0132531A1 discloses a semiconductor packaging structure 24 with a bottom electrode of a semiconductor chip exposed and used for supporting surface mounting technology. Here, a power MOSFET 10 is arranged in an interior space of a cup-shaped metal can 12 and a drain electrode at one side of the MOSFET 10 is connected to the bottom of the interior space of the cup-shaped metal can 12 through a layer of conductive epoxy 14, so that the drain electrode of the MOSFET 10 is electrically connected to an extruding edge 22 of the cup-shaped metal can 12, while a source electrode 18 and a gate electrode (not shown) located at the other side of the MOSFET 10 become sub-flush with the surface of the extruding edge 22. Low stress and high adhesion epoxy 16 is provided to fill in gaps in the interior space of the cup-shaped metal can 12 surrounding the MOSFET 10. The semiconductor packaging structure 24 improves the heat dissipation performance. However, it is expensive to form the cup-shaped metal can 12 in actual production. In addition, both the source electrode and the gate electrode of the MOSFET 10 are fixed in the packaging structure 24, as a result the contact surface of the gate electrode cannot be adjusted to level with the extruding edge 22, thus it is hard to match the contact surface of the gate electrode with a pad on a PCB (Printed Circuit Board), which limits the application of the semiconductor packaging structure 24.

In addition, the resistance of a substrate in the chip of the power device is usually high, this makes the RDSon of the device correspondingly high; therefore, there is a need to reduce the resistance of the substrate of the chip. In a conventional wafer level chip scale packaging (WLCSP), packaging test is performed and ball placement on a wafer (for ball bonding) is carried out after the processing of all power devices in the whole wafer is completely finished, individual IC (Integrated Circuit) is then singulated with its size being same as the desired original chip.

Given the above description of related prior arts, therefore, there is a need to manufacture ultra thin chips by WLCSP and to apply these chips in power devices.

BRIEF DESCRIPTION OF THE DRAWINGS

The embodiment of the present invention is described more sufficiently through the drawings. However, the drawings are only used for explaining and illustrating rather than limiting the scope of the invention.

FIG. 1 is a cross sectional schematic diagram of the semiconductor packaging structure of the prior art.

FIGS. 2A-2E are structural schematic diagrams of the power devices according to a first embodiment of the present invention.

FIGS. 3A-3F are schematic diagrams illustrating a process for preparing the primary packaging structure of the power devices of the present invention.

FIGS. 4A-4C are cross sectional schematic diagrams illustrating a process for preparing the power devices of the present invention.

FIGS. 5A-5B are cross sectional schematic diagrams illustrating the power devices according to a second embodiment of the present invention.

FIGS. 6A-6D are structural schematic diagrams illustrating the power devices according to a third embodiment of the present invention.

FIGS. 7A-7C are structural schematic diagrams illustrating the power devices according to a fourth embodiment of the present invention.

DETAILED DESCRIPTION OF THE PREFERRED EMBODIMENTS

FIG. 2A and FIG. 2B are schematic diagrams showing a top view and a bottom view of the power device 100A of a first embodiment of the present invention. FIG. 2C and FIG. 2D-1 are cross sectional views of the power device 100A along a plane AA and along a plane BB respectively shown in FIG. 2B. The power device 100A comprises a lead frame unit including a first base 111, a second base 112, a third base 113 and a fourth base 114 (as shown in FIG. 2B). The thicknesses of all the bases are basically the same and the bases are arranged on the same plane. The first base 111 preferably has a square shape. The third base 113 and the fourth base 114 are arranged at two opposite sides of the first base 111 respectively and extend along the edges of the first base 111, and the second base 112 is positioned adjacent to the first base 111 between the third base 113 and the fourth base 114. In one embodiment, the third base 113 and the fourth base 114 are symmetrical relative to the center of the first base 111, thus the second base 112 is positioned on a line of symmetry of the third base 113 and the fourth base 114. Usually, a lead frame strip comprises a plurality of such lead frame units with the bases connected to the lead frame strip through connecting bars (not shown).

As shown in FIG. 2C and FIG. 2D-1, the power device 100A also comprises a primary packaging structure 130 that is a completely packaged structure rather than an unpackaged original chip. The primary packaging structure 130 includes a semiconductor chip 131 that is flipped and attached onto the first base 111 and the second base 112. Conductive epoxy (such as conductive solder or paste) is used for forming a plurality of balls or bumps 132a-1 and 132b-1 on the front surface of the primary packaging structure 130 for attaching it onto the second base 112 and the first base 111 respectively. As shown in FIGS. 2C and 2D-1, the primary packaging structure 130 comprises a semiconductor chip 131 and a top plastic packaging layer 134 covering the front surface of the chip 131. The front surface of the chip 131 is provided with a plurality of metal pads. The solder bumps 132a-1 and 132b-1 are placed on the metal pads, which will be described in details later. The top plastic packaging layer 134 of the primary packaging structure 130 are only encapsulated on the side walls of the solder bumps 132a-1 and 132b-1. A bottom metal layer 133 is formed at the back surface of the chip 131.

The power device 100A also comprises a bridge-shaped metal clip 150 (also shown in FIG. 2E) attached to the bottom surface of the flipped primary packaging structure 130 or to the bottom surface of the bottom metal layer 133 of the flipped chip 131. The bridge-shaped metal clip 150 is also attached to the third base 113 and the fourth base 114. The bridge-shaped metal clip 150 comprises a top metal portion 151 and side metal portions 153a and 153b connected to two opposite sides of the top metal portion 151. The side metal portions 153a and 153b are bent downwards as shown in FIG. 2C. In particular, the side metal portions 153a and 153b are bent away from each other, so that the angles formed between the side metal portions 153a and 153b and the top metal portion 151 are obtuse angles. In one embodiment, the side metal portions 153a and 153b are symmetrically located relative to the center of the top metal portion 151. In addition, a groove 113a is formed on the top surface of the third base 113 and a groove 114a is formed on the top surface of the fourth base 114. As a result the side metal portion 153a can be attached and trapped in the groove 113a, likewise the side metal portion 153b can be attached and trapped in the groove 114a. A conductive material 140, such as a conductive solder or paste, is applied to bond the bottom surface of the top metal portion 151 to the bottom metal layer 133. The groove 113a and the groove 114a can be of many shapes, for example, the grooves 113a and 114a can be in V-shape, as shown in FIG. 2C, for convenient engagement with the side metal portions 153a and 153b. The side metal portions 153a and 153b are respectively attached to the third base 113 and the fourth base 114 through conductive epoxy deposited in the groove 113a and the groove 113b.

Furthermore, the power device 100A also comprises a plastic packaging body 160 encapsulating the lead frame unit, the primary packaging structure 130 and the bridge-shaped metal clip 150. As shown in FIG. 2B where the power device 100A is finally mounted on a PCB with the first base 111, the second base 112, the third base 113 and the fourth base 114 serving as electrical contacts directly connected to the pads on the PCB. Here, the respective bottom surfaces of the first base 111, the second base 112, the third base 113 and the fourth base 114 should be exposed from the bottom surface of the plastic packaging body 160. Furthermore, as shown in FIG. 2B, the third base 113 and the fourth base 114 usually include a plurality of pins, for example pins 113' and pins 114'. Therefore, the bottom surfaces of the pins 113' and the pins 114' are also exposed from the bottom surface of the plastic packaging body 160 and serving as the electrical contacts of the third base 113 and the fourth base 114.

In the embodiment shown in FIGS. 2C to 2D-1, one or more through holes 152 are formed through the whole thickness of the top metal portion 151. FIG. 2E shows a top view of the bridge-shaped metal clip 150 including a through hole 152. The through hole 152 can be of a 'cross' shape as shown in FIG. 2E or can be of round, rectangle, polygon or any other suitable shapes. The through hole 152 is used for venting gas during the reflow of the conductive material 140 that attaches the top metal portion 151 to the bottom metal layer 133. Additionally, any excess of the conductive material 140 deposited to form a conductive layer between the top metal portion 151 and the bottom metal layer 133 can be dredged into the through holes 152 so that the final layer thickness of the conductive material 140 is uniform.

In another embodiment as shown in FIG. 2D-2, one or more clip grooves 152' can be formed from a bottom surface of the top metal portion 151 with the bottom of the clip groove 152' ended up inside the top metal portion 151. The groove 152' may be of many shapes similar to the through holes 152 as described above. Similar to the though hole 152, the clip groove 152' is used for venting gas during the reflow of the conductive material 140 for attaching the top portion 151 to the bottom metal layer 133 and for holding any excess of the conductive material 140 deposited to form a conductive layer between the top metal portion 151 and the bottom metal layer 133 thus improving the thickness uniformity of the conductive material 140.

Another difference between the embodiment of FIG. 2D-1 and that of FIG. 2D-2 is that the top surface of the top metal portion 151 as shown in FIG. 2D-1 is not exposed from the plastic packaging body 160 whereas the top surface of the top metal sheet 151 as shown in FIG. 2D-2 is exposed from the plastic packaging body 160. To achieve a structure as shown in FIG. 2D-2, before depositing a plastic packaging material, such as epoxy resin, to form the plastic packaging body 160, a resist film (not shown) can be applied to the inner surface of the top chase of the molding tool, which is then brought in contact with and covers the top surface of the top metal portion 151 thus preventing it from coverage by the plastic packaging materials. The plastic packaging body 160 encapsulates the lead frame unit, the primary packaging structure 130 and the side metal portions 153a and 153b of the bridge-shaped metal clip 150. After the plastic packaging material is solidified, the resist film is peeled off from the top surface of the top metal portion 151, thus the top surface of the top metal portion 151 is now exposed from the top surface of the plastic packaging body 160. This plastic packaging process is usually completed at a wafer processing level (i.e., this technology is used in WLCSP), which is well known in the art.

In another embodiment of the invention, recessed portions 154a and 154b formed on the top surface of the top metal portion 151 at the corner of the top metal portion 151 are configured to connect the side metal portions 153a and 153b thus forming a step structure. FIGS. 2C-2E illustrate the structure of the bridge-shaped metal clip 150. Typically, the side metal portions 153a and 153b are originally formed on the same plane of the top metal portion 151, then the side metal portions 153a and 153b are bent downward by an angle (through a stamping method), so that the angles formed between the side metal portions 153a and 153b and the top metal portion 151 are obtuse angles. However, the thus obtained final top metal portion 151 is not a flat plane and the edges of the top surface of the top metal portion 151 at the corner of the top metal portion 151 and the side metal portions 153a 153b do not form a straight line. Therefore, the recessed portions 154a and 154b at the corner of the top metal portion 151 and the side metal portions 153a 153b can beneficially buffer and stop the tension influences of the side metal portions 153a and 153b on the top metal portion 151 during the stamping step with the thus obtained top metal portion 151 free of deformation, in which case lines 151a-1 and 151a-2 at the two sides of the top surface of the top metal portion 151 are now straight lines and the top surface of the top metal portion 151 is now a flat rectangular plane.

FIGS. 3A-3F illustrate a method for preparing the primary packaging structure 130. A wafer 1310 (shown in FIG. 3C) usually includes numerous semiconductor chips 131 (shown in FIG. 3A) formed at the top surface of the wafer and spaced-apart by scribe lines (not shown), which is well known in the art. The front surface of the chip 131 includes numerous metal pads 132, such as aluminum-silicon pads, which serve as the electrodes of the chip or the terminals for off-chip signal transmission. In a preferred embodiment, the chip 131 is a vertical power metal oxide semiconductor field effect transistor (MOSFET). The metal pads 132 include metal pads 132b forming the first electrode (such as a source electrode) of the chip 131 and a metal pad 132a forming the second electrode (such as a gate electrode) of the chip 131, while the drain electrode area of the chip 131 is formed at the back surface of the chip 131 (not shown). Firstly, numerous solder bumps are formed on the metal pads 132 by ball placement or plating and the likes. As shown in FIG. 3B, a solder bump 132a-1 is formed on the metal pad 132a and a solder bumps 132b-1 are formed on the metal pads 132b. As the area of the metal pad 132b forming the source electrode is usually larger than that of the metal pad 132a forming the gate electrode, the size of the solder bumps 132b-1 is also larger than that of the solder bumps 132a-1 to carry large currents. Alternatively, numerous solder balls of smaller size than the solder bump 132b-1 can be placed on the metal pad 132b (not shown) and are closer to each other, so that the solder balls can be merged into one piece after being heated, softened and melted to form the solder bump 132b-1 of a larger size. As shown in FIG. 3C, a plastic packaging layer 1340 is formed on the front surface of the wafer 1310 covering all the solder bumps 132a-1 and 132b-1. Then the plastic packaging layer 1340 is ground until the solder bumps 132a-1 and 132b-1 are exposed through the plastic packaging layer 1340. As shown in FIG. 3D, the top surfaces of the solder bumps 132a-1 and 132b-1 and the top surface of the plastic packaging layer 1340 are co-planar. The plastic packaging layer 1340 physically supports the wafer 1310. Therefore, when the wafer 1310 is ground and thinned, the wafer 1310 is not prone to crackage. This means that highly desirable ultra-thin chips with reduced substrate resistance can be made. As shown in FIG. 3E, after the back surface of the wafer 1310 is ground and thinned, impurity ions can be heavily doped into the back surface of the thinned wafer 1310 (optionally), and then a metal layer 1330 can be deposited onto the back surface of the thinned wafer 1310 forming the drain electrode at the back surface of the chip. The wafer 1310, the plastic packaging layer 1340 and the metal layer 1330 (as shown in FIG. 3E) are then cut apart to form individual primary packaging structures 130 (as shown in FIG. 3F), each of which includes a single chip 131 and a top plastic packaging layer 134 covering the front surface of the chip 131. The top plastic packaging layer 134 only covers the side walls of the solder bumps 132a-1 and 132b-1 with the top surface of the solder bumps 132a-1 and 132b-1 exposed through the top plastic packaging layer 134 and is co-planar with the top surface of the top plastic packaging layer 134. In this step, the metal layer 1330 is also cut apart into numerous bottom metal layers 133, each of which covers the back surface of a chip 131 and is contact with the drain area at the back surface of the chip 131 forming the third electrode (such as the drain electrode) of the chip 131.

As shown in FIG. 2D-1, the solder bump 132b-1, formed on the metal pad 132b forming the first electrode of the chip, is attached to the top surface of the first base 111. As shown in FIG. 2C, the solder bump 132a-1, formed on the metal pad 132a forming the second electrode of the chip, is attached to the top surface of the second base 112. As shown in FIG. 2B, the surface area of the first base 111 forming the source electrode is usually larger than the surface area of the second base 112 forming the gate electrode. Therefore, the exposed area of the bottom surface of the first base 111 is larger than the exposed area of the bottom surface of the second base 112, which also performs the function of heat dissipation. The third base 113 and the fourth base 114 are electrically connected to the drain electrode of the chip 131 through the bridge-shaped metal clip 150.

FIGS. 4A-4C illustrate a method for preparing the power device 100A shown in FIG. 2D-1 along the line BB of FIG. 2B. However, the preparation of the power device 100A shown in FIG. 2C along the line AA of FIG. 2B is also described but not shown in FIGS. 4A-4C. In FIG. 4A, a lead frame unit is provided firstly. The lead frame unit includes the first base 111, the second base 112, the third base 113 and the fourth base 114, all of which are separated from each other, with the third base 113 and the fourth base 114 respectively arranged at the two opposite sides of the first base 111 as described above. The primary packaging structure 130 is then attached on the first base 111 and the second base 112 of the lead frame unit by a conductive epoxy. In this step, the plurality of solder bumps 132b-1 and 132a-1 (see FIG. 3F) formed on the front surface of the primary packaging structure 130 are respectively attached to the first base 111 and the second base 112 by a conducting material, such as the conducting material 120b shown in FIG. 4A. In FIG. 4B, the bridge-shaped metal clip 150 is mounted atop the primary packaging structure 130. The bridge-shaped metal clip 150 comprises the top metal portion 151 and the side metal portions 153a and 153b connected to two opposite sides of the top metal portion 151 and bent downwards. In this step, the top metal portion 151 is directly attached to the primary packaging structure 130. The side metal portions 153a and 153b are respectively aligned and positioned in the groove 113a at the top surface of the third base 113 and the groove 114a at the top surface of the fourth base 114. Conductive epoxy is deposited in the groove 113a and the groove 114a for attaching the side metal portions 153a and 153b of the bridge-shaped metal sheet 150 to the third base 113 and the fourth base 114 respectively. As such, the bridge-shaped metal clip 150 is precisely located in the groove 113a and the groove 114a. A bottom metal layer 133 at the back surface of the primary packaging structure 130 is connected to the bottom surface of the top metal portion 151 through the conductive material 140. In FIG. 4C, the plastic packaging material is deposited to form the plastic packaging body 160 encapsulating the lead frame unit, the primary packaging structure 130 and the bridge-shaped metal clip 150. The bottom surfaces of the first base 111, the second base 112, the third base 113 and the fourth base 114 of the lead frame unit are exposed from the bottom surface of the plastic packaging body 160, while the top surface of the top metal portion 151 can be selected whether to be exposed from the top surface of the plastic packaging body 160 or not. In FIG. 4C, the top metal portion 151 is covered by the plastic packaging body 160 and the through hole 152 in the top metal portion 151 is filled with plastic packaging material.

FIGS. 5A-5B illustrate a structure of a power device 100B according to another embodiment of the invention. The structure of power device 100B is mostly similar as the structure of power device 100A excepting the structure of the bridge-shaped metal clip 150. As shown in these figures, the top metal portion 151 does not include a through hole. Instead it includes pluralities of dimples 155 formed on the bottom surface of the top metal portion 151. The dimples 155 extrude from the bottom surface of the top metal portion 151 and are located between the bottom metal layer 133 and the bottom surface of the top metal portion 151 after the bridge-shaped metal clip 150 is mounted on the primary packaging structure 130. With the dimples formed between the bottom metal layer 133 and the bottom surface of the top metal portion 151, the thickness of the conducting material 140 is uniform. As shown in FIG. 5B, the top surface of the top metal portion 151 of the power device 100B is not exposed from the plastic packaging body 160. Alternatively, the top surface of the top metal portion 151 can be exposed from the top surface of the plastic packaging body 160 (not shown).

FIGS. 6A-6D illustrate a power device 100C of another embodiment of the invention with the structure and the position of a second base of the lead frame unit different from that in the power devices 100A and 100B. FIGS. 6B and 6C are cross sectional schematic diagrams along the dotted lines AA and BB in FIG. 6A respectively. As shown in FIGS. 6A and 6B, the second base 212 includes a base extension 212a and an external pin 212b connected to the base extension 212a. The thickness of the base extension 212a is thinner than the thickness of the first base 111 and thus the base extension 212a is encapsulated inside the plastic packaging body 160. Only the bottom surface of the external pin 212b is exposed from the bottom surface of the plastic packaging body 160.

As shown in FIG. 6A, the length of the fourth base 214 is shorter than the length of the third base 113 and the external pin 212b is arranged on the same side as the fourth base 214. Particularly the external pin 212b and a plurality of pins 214' in the fourth base 214 are arranged on the same straight line. The base extension 212a extends under the primary packaging structure 130 until the solder bump 132a-1 on the front surface of the primary packaging structure 130 superimposed on the base extension 212a. As such, the conducting material 120a is deposited for attaching the solder bumps 132a-1 on the top surface of the base extension 212a. As shown in FIGS. 6B-6C, the top surface of the base extension 212a and the top surface of the first base 111 are arranged on the same plane substantially, so that the primary packaging structure 130 is easily mounted on the first base 111 and the base extension 212a of the second base 212. The thickness of the base extension 212a is thinner than the thickness of the first base 111 so that the extension base 212a is encapsulated inside the plastic packaging body 160 to avoid any negative effect on subsequent SMI technology. The external pin 212b and the fourth base 214 are arranged on the same straight line, therefore, to avoid a short circuit between the external pin 212b and the bridge-shaped metal clip 150, as shown in FIG. 6D, the bridge-shaped metal clip 150 includes a shorter side metal portion 153'b for connecting to the fourth base 214 without connecting to the external pin 212b of the second base 212. Particularly, the width $D_1$ of the side metal portion 153'b is smaller than the width $D_2$ of the top metal portion 151, while the width of the side metal sheet 153a is the same as the width $D_2$ of the top metal portion 151. In the power device 100C, the top surface of the top metal portion 151 is covered by the plastic packaging body 160.

FIGS. 7A-7C illustrate a power device 100D of another embodiment of the invention. The power device 100D is similar to the power device 100C, excepting that the top surface of the top metal portion 151 is exposed from the plastic packaging body 160. FIG. 7C is a top view of the power device 100D showing the top metal portion 151 is exposed from the plastic packaging body 160, which is also used to improve the heat dissipation of the power device.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A power device with bottom source electrode comprising:
   a lead frame unit comprising a first base and a second base separated from each other, a third base and a fourth base located at two opposite sides of the first base;
   a primary packaging structure attached to the first base and the second base, the primary packaging structure comprising a front surface and a plurality of solder bumps formed thereon, said solder bumps being further attached respectively to the first base and the second base;
   a bridge-shaped metal clip attached atop the primary packaging structure, the bridge-shaped metal clip comprises a top metal portion and side metal portions that are:
      connected to two opposite sides of the top metal portion; and
      are bent downwards
   such that a first predetermined members of the side metal portions are positioned and trapped into a groove formed on the top surface of the third base and a second predetermined members of the side metal portions are aligned and positioned and trapped into a groove formed on the top surface of the fourth base;
   a bottom metal layer formed at a back surface of the primary packaging structure and connected to a bottom surface of the top metal portion through a conductive material; and
   a plastic packaging body encapsulating the lead frame unit, the primary packaging structure and the bridge-shaped metal clip, wherein the bottom surfaces of the first base, the third base and the fourth base are all exposed through the bottom surface of the plastic packaging body.

2. The power device of the claim 1, wherein the primary packaging structure further comprising a semiconductor chip, a top plastic packaging layer covering both a front surface of the semiconductor chip and a bottom metal layer formed at a back surface of the semiconductor chip, wherein the plurality of solder bumps are respectively attached to a corresponding number of metal pads formed on the front surface of the semiconductor chip, and wherein the top plastic packaging layer surrounds side walls of the solder bumps so that the solder bumps are exposed through the top plastic packaging layer.

3. The power device of claim 1, wherein the second base is located between the third base and the fourth base.

4. The power device of claim 3, wherein the primary packaging structure further comprising a semiconductor chip, the plurality of solder bumps being respectively attached to a corresponding number of metal pads formed on the front surface of the semiconductor chip, the number of metal pads comprise at least a metal pad forming a first electrode and a metal pad forming a second electrode of the semiconductor chip, wherein those solder bumps connected to the metal pad forming the first electrode is connected to the top surface of the first base and those solder bumps connected to the metal pad forming the second electrode is connected to the top surface of the second base.

5. The power device of claim 3, wherein a bottom surface of the second base is exposed through the bottom surface of the plastic packaging body.

6. The power device of claim 1 wherein the second base comprises a base extension and an external pin connected to the base extension; the base extension is thinner than the first base so that the base extension is encapsulated inside the plastic packaging body; the external pin is located on the same line of the fourth base; and wherein the base extension extends to the primary packaging structure until said plurality of solder bumps overlap the base extension.

7. The power device of claim 6 wherein the primary packaging structure further comprising a semiconductor chip and said plurality of solder bumps are respectively attached to a plurality of metal pads located on the front surface of the semiconductor chip, the plurality of metal pads comprising at least a metal pad forming the first electrode and a metal pad forming the second electrode of the semiconductor chip wherein the solder bump connected to the metal pad forming the first electrode is attached to the top surface of the first base and the solder bump connected to the metal pad forming the second electrode overlaps and is attached to the base extension.

8. The power device of claim 6 wherein a bottom surface of the external pin is exposed through the bottom surface of the plastic packaging body.

9. The power device of claim 6 wherein a width of a side metal portion that is connected to the fourth base is made smaller than the width of the top metal portion to prevent the side metal portion from connecting to the second base.

10. The power device of claim 1 wherein one or more through holes are formed in the top metal portionand said through holes are configured to penetrate through the thickness of the top metal portion.

11. The power device of claim 1 wherein one or more clip grooves are formed from the bottom surface of the top metal portion to the inside of the top metal portion.

12. The power device of claim 1 wherein a plurality of dimples are formed on the bottom surface of the top metal portion with said dimples extruding below the bottom surface of the top metal portionand said dimples are located between the bottom metal layer and the bottom surface of the top metal portion.

13. The power device of claim 1 wherein a plurality of recessed portions are formed on the top surface of the top metal portion and further located at the corner between the top metal portion and the side metal portions.

14. The power device of claim 2 wherein the bottom metal layer is formed on the back surface of the semiconductor chip forming a third electrode of the semiconductor chip, wherein the semiconductor chip is a MOSFET (Metal Oxide Semiconductor Field Effect Transistor), in which the first electrode of the semiconductor chip is a source electrode, the second electrode of the semiconductor chip is a gate electrode and the third electrode of the semiconductor chip is a drain electrode.

15. The power device of claim 1 wherein the top surface of the top metal portion is covered by the plastic packaging body.

16. The power device of claim 1 wherein the top surface of the top metal portion is exposed through the plastic packaging body.

* * * * *